United States Patent
Li et al.

(10) Patent No.: US 10,134,634 B2
(45) Date of Patent: Nov. 20, 2018

(54) METAL-ASSISTED CHEMICAL ETCHING OF A SEMICONDUCTIVE SUBSTRATE WITH HIGH ASPECT RATIO, HIGH GEOMETIC UNIFORMITY, AND CONTROLLED 3D PROFILES

(71) Applicant: Georgia Tech Research Corporation, Atlanta, GA (US)

(72) Inventors: Liyi Li, Atlanta, GA (US); Ching Ping Wong, Berkeley Lake, GA (US); Jack K. Moon, Duluth, GA (US); Xueying Zhao, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 14/930,161

(22) Filed: Nov. 2, 2015

(65) Prior Publication Data

US 2016/0126133 A1    May 5, 2016

Related U.S. Application Data

(60) Provisional application No. 62/074,990, filed on Nov. 4, 2014, provisional application No. 62/239,567, filed
(Continued)

(51) Int. Cl.
*H01L 21/76* (2006.01)
*H01L 21/768* (2006.01)
(Continued)

(52) U.S. Cl.
CPC .. *H01L 21/76898* (2013.01); *H01L 21/30604* (2013.01); *H01L 21/67086* (2013.01); *H01L 21/78* (2013.01)

(58) Field of Classification Search
CPC ......... H01L 21/76816; H01L 21/30604; H01L 21/67086; H01L 21/76804; H01L 21/76877; H01L 21/76898; H01L 21/78
See application file for complete search history.

(56) References Cited

U.S. PATENT DOCUMENTS

| | | | | |
|---|---|---|---|---|
| 5,472,913 A | * | 12/1995 | Havemann | H01L 21/02126 257/E21.273 |
| 6,017,825 A | * | 1/2000 | Kim | H01J 37/321 216/68 |

(Continued)

OTHER PUBLICATIONS

Li, et al., "High-Speed Wet Etching of Through Silicon Vias (TSVs) in Micro-and Nanoscale", School of Materials Science and Engineering, Georgia Institute of Technology, Atlanta, GA USA, 5 pages.

(Continued)

*Primary Examiner* — Fernando L Toledo
*Assistant Examiner* — Neil Prasad
(74) *Attorney, Agent, or Firm* — Thomas | Horstemeyer, LLP

(57) ABSTRACT

An embodiment of a method for metal-assisted chemical etching of a semiconductive substrate comprises forming a patterned coating on a top surface of a substrate layer of a silicon wafer; applying a noble metal layer over the patterned coating such that a portion of the noble metal layer is in contact with the top surface of the substrate layer; and immersing the silicon wafer in a wet etching solution to form a trench under the portion of the noble metal layer that is contact with the top surface of the substrate layer. Further, the trench may be filled with copper material to form a through silicon via structure. Such embodiments provide etching techniques that enable etched formations that are
(Continued)

deep (e.g., high-aspect-ratio) and uniform as opposed to shallow etchings (i.e., low-aspect-ratio) or non-uniform deep etchings.

20 Claims, 19 Drawing Sheets

Related U.S. Application Data on Oct. 9, 2015, provisional application No. 62/166,920, filed on May 27, 2015.

(51) Int. Cl.
*H01L 21/78* (2006.01)
*H01L 21/306* (2006.01)
*H01L 21/67* (2006.01)

(56) References Cited

U.S. PATENT DOCUMENTS

| | | | | |
|---|---|---|---|---|
| 2008/0047366 A1* | 2/2008 | Kuriyama | ............ | G01L 1/2268 73/862.627 |
| 2011/0104840 A1* | 5/2011 | Burdinski | ............ | B82Y 10/00 438/34 |
| 2014/0256078 A1* | 9/2014 | Jin | ............ | B81C 1/00515 438/57 |
| 2014/0264937 A1* | 9/2014 | Meitl | ............ | H01L 21/76898 257/774 |
| 2014/0295331 A1* | 10/2014 | Wang | ............ | G03F 7/00 430/9 |
| 2015/0137186 A1* | 5/2015 | Leidy | ............ | H01L 29/7371 257/197 |
| 2016/0079078 A1* | 3/2016 | Asano | ............ | C09K 13/08 438/694 |

OTHER PUBLICATIONS

Li, et al., "Wet Etching of Deep Trenches on Silicon with Three-Dimensional (3D) Controllability", School of Materials Science and Engineering, Georgia Institute of Technology, Atlanta, GA USA, 6 pages.

\* cited by examiner

METAL-ASSISTED CHEMICAL ETCHING OF A SEMICONDUCTIVE SUBSTRATE WITH HIGH ASPECT RATIO, HIGH GEOMETIC UNIFORMITY, AND CONTROLLED 3D PROFILES

CROSS-REFERENCE TO RELATED APPLICATION

This application claims priority to U.S. provisional applications entitled, "Wafer-Level Uniform Wet Etching of Micro- and Nanostructures on Silicon Substrate," having Ser. No. 62/074,990, filed Nov. 4, 2014, which is entirely incorporated herein by reference; "Uniform Metal-Assisted Chemical Etching of Semiconductive Substrate by Sputtered Catalyst," having Ser. No. 62/239,567, filed Oct. 9, 2015, which is entirely incorporated herein by reference, and "Uniform High-Aspect-Ratio 3D Micro- and Nanomanufacturing on Silicon by (Electric Bias Attenuated)-Metal-assisted Chemical Etching (E-MaCE)," having Ser. No. 62/166,920, filed May 27, 2015, which is entirely incorporated herein by reference.

STATEMENT REGARDING FEDERALLY SPONSORED RESEARCH OR DEVELOPMENT

This invention was made with government support under contract CMMI1130876 awarded by the National Science Foundation. The government has certain rights in the invention.

TECHNICAL FIELD

The present disclosure is generally related to chemical etching techniques.

BACKGROUND

The performance of a microelectronic system depends on the density of devices integrated in the system. In the past few decades, miniaturization of active devices has been the major focus for promoting the system performance. However, as the scaling down of active devices becomes increasingly challenging, more attention is focused on the miniaturization of interconnects between active devices.

SUMMARY

Embodiments of the present disclosure provide systems and methods for metal-assisted chemical etching of a semiconductive substrate. Briefly described, one embodiment of such a method comprises forming a patterned coating on top surface of a substrate layer of a silicon wafer; applying a noble metal layer over the patterned coating such that a portion of the noble metal layer is in contact with the top surface of the substrate layer; and immersing the silicon wafer in a wet etching solution to form a trench under the portion of the noble metal layer that is contact with the top surface of the substrate layer. Further, the trench may be filled with copper material to form a through silicon via structure.

The present disclosure can also be viewed as providing an additional embodiment of a method comprising forming a patterned coating on a top surface of a substrate layer of a silicon wafer; applying a noble metal layer over the patterned coating such that a portion of the noble metal layer is in contact with the top surface of the substrate layer of the silicon wafer; cutting the silicon wafer into a plurality of chips; applying a negative voltage bias to one or more of the plurality of chips; and immersing the one or more of the plurality of chips having the negative voltage bias in a wet etching solution to form a trench under the portion of the noble metal layer that is contact with the top surface of the substrate layer. In addition, the trench may be filled with copper material to form a through silicon via structure for individual ones of the plurality of chips.

Such embodiments provide etching techniques that enable etched formations that are deep (e.g., high-aspect-ratio) and uniform as opposed to shallow etchings (i.e., low-aspect-ratio) or non-uniform deep etchings. Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

The performance of a microelectronic system depends on the density of devices integrated in the system. In the past few decades, miniaturization of active devices has been the major focus for promoting the system performance. However, as the scaling down of active devices becomes increasingly challenging, more attention is focused on the miniaturization of interconnects between active devices. Silicon interposer technology provides a technologically promising and economically viable way for achieving high density interconnects in microelectronic systems.

Typically, silicon interposers use standard silicon (Si) wafers as substrates in which vertical holes are etched through the Si wafer. The through holes may be filled with copper to connect the integrated circuits (ICs) bonded on both sides of the interposer. The vertical holes with copper filling are commonly referred as through silicon vias (TSVs), which are one of the key components in advanced Si interposer technology. TSVs provide vertical interconnects between stacked components which significantly shorten the length of interconnection compared to traditional two-dimensional interconnects. Compared to interposers based on other materials (for example, glass and polymer), Si interposers possess the merits of good electrical performance, good thermal-mechanical compatibility with other devices, etc. TSVs are widely considered as the key components in the next-generation IC integration as well as 3D packaging. However, manufacturing cost of TSVs in Si interposers is still very high.

One of the major costs for TSVs fabrication comes from TSVs formation, which is currently realized by deep reactive ion etching (DRIE) or high power lasers, which suffer from limited throughput and high cost. In DRIE, Si wafers are put in a gas chamber and etched under plasma. The instruments for DRIE are expensive and the throughput is low.

In accordance with the present disclosure, an exemplary technique for TSVs formation is introduced and referred as metal-assisted chemical etching (MaCE). In an embodiment of MaCE, high-aspect-ratio micro- and nanostructures on Si wafer can be etched by immersing the Si wafer with lithographically-patterned metal catalysts in a wet solution bath. In order to achieve uniformity in the wafer-level etching, a two key process, i.e. mass transport and charge transport, is rationally designed and carefully controlled.

Figure 1A:
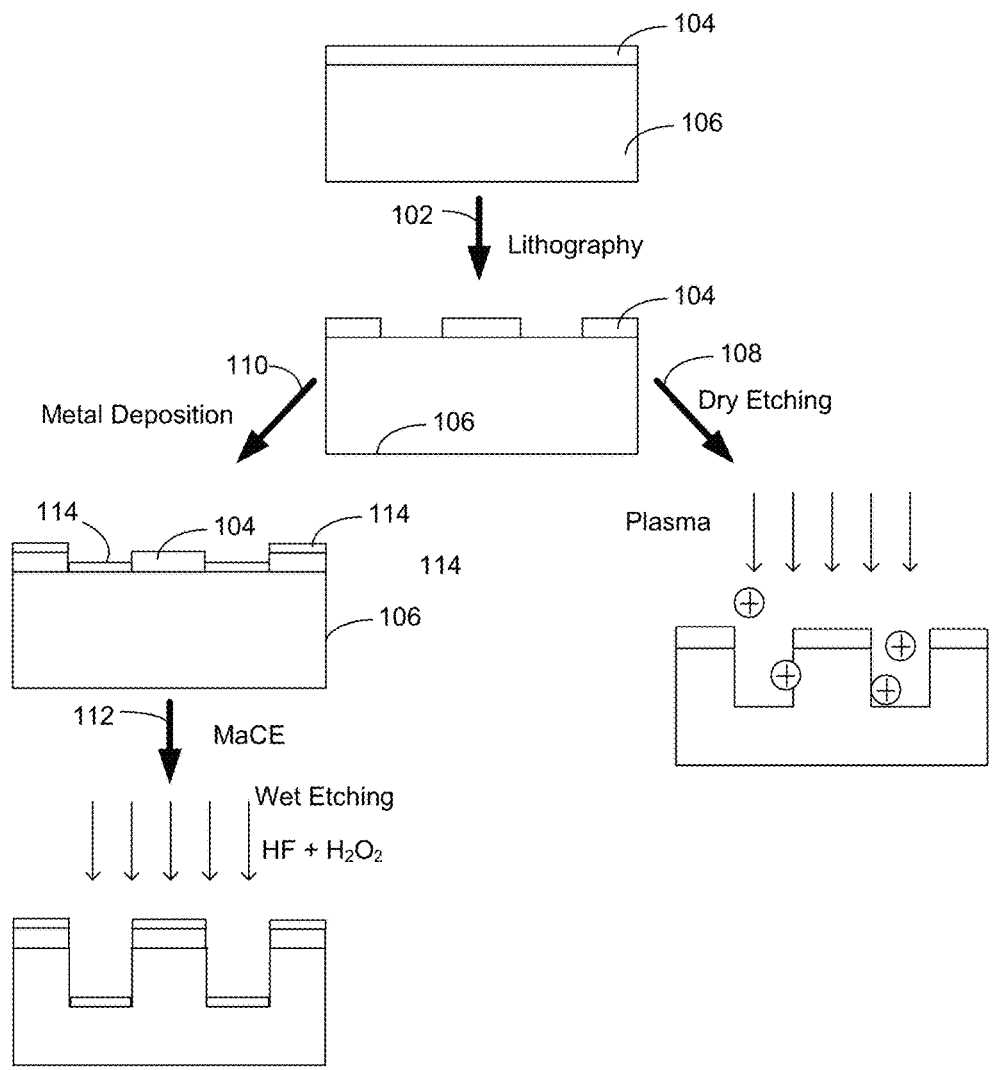
FIG. 1(a) is a schematic processing flow of a metal-assisted chemical etching (MaCE) process versus a deep reactive ion etching process in accordance with embodiments of the present disclosure.

As a point of comparison, a schematic processing flow of an embodiment of MaCE versus DRIE is shown in FIG. 1(a). The two processes can share the same lithography step 102 before etching. In the lithography step, patterns are transferred on a polymeric layer 104 (referred as photoresist or e-beam resist, depending on the source of exposure). After lithography, the substrate 106 to be etched is placed inside a plasma chamber for a dry etching step 108 such as DRIE using plasma. The plasma tool for DRIE is known to be expensive. Consider that the price of the DRIE tool increases exponentially when the size of substrate increases. For example, a DRIE tool for 4 inch wafer is approximately $300,000 USD, while the tool for an 8 inch wafer is over $1 million USD.

However, if MaCE is used for the same etching process as part of a wet etching step 112, the substrate 106 will go through a metal deposition step 110 and the wet etching step 112 instead of the dry etching step 108. The two steps together (metal deposition step 110 and wet etching step 112) are significantly cheaper than DRIE (<$10,000) even for a 12 inch wafer.

In one embodiment, an exemplary metal deposition technique includes loading the silicon substrate 106 with a noble metal as a catalyst on a top surface of the substrate 106. Accordingly, a layer of metal catalyst 114 is applied to be in close contact with the silicon substrate 106. In order to ensure uniform etching across the whole wafer (e.g., 4 inch wafer), the thickness of the noble metal catalysts on the whole wafer should be uniform, e.g., having variation below 1 nm. In one embodiment, gold (Au) catalyst can be deposited through electron-beam evaporation (EBE) for uniform MaCE. However, the pumping time required for EBE in each batch of production may be significant, thus slowing down the speed of overall production by MaCE. Accordingly, an alternative embodiment makes use of DC sputtering to deposit Au catalysts that can produce uniform TSV. The success of uniform MaCE by sputtered Au catalysts may significantly increase the production speed by MaCE and enhance its competitiveness over currently available etching methods, such as deep reactive ion etching. From experimental testing, after Au sputter, the morphology of Au catalysts is found to vary with the sputter time. For example, for experimental tests in which Au catalysts are formed with the sputter time of 30 seconds, 50 seconds and 70 seconds, the optimized condition was observed for the sputter time of 50 seconds.

In one embodiment, an exemplary wet etching technique includes immersing the metal loaded sample or wafer in a solution of $H_2O_2$ and HF (e.g., 340 mL HF—$H_2O_2$ etchant (volumetric ratio $H_2O$:$H_2O_2$(30% wt):HF(10% wt) 12:10:10) for 2 hours), whereby holes ($h^+$) are injected into the silicon valence band by the catalytic reduction of $H_2O_2$ on metal surface: $H_2O_2 \rightarrow H_2O + h^+$. Therefore, the hole-bearing silicon volume is dissolved by HF and the metal catalyst 114 will move into the etched space to assist further etching, as described by the following chemical equation:

$$Si + h^+ + HF \rightarrow SiF_6^{2-} + H^+.$$

In MaCE, only the volume of the substrate (e.g., silicon) 106 that was in contact with the metal catalyst layer 114 is selectively etched. In one embodiment, by using randomly deposited Au nanoparticles, anisotropic pores with diameters comparable to the catalysts are formed across the whole substrate 106. Via one embodiment of MaCE, vertical pores are managed to be etched with a width down to 30 nm and aspect ratio over 100. In such an embodiment, silicon substrates 106 seeded with metal catalyst 114 are etched in liquid etchant solution composed of hydrofluoric acid (HF) and hydrogen peroxide ($H_2O_2$) following the equation:

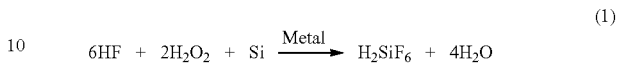

$$6HF + 2H_2O_2 + Si \xrightarrow{Metal} H_2SiF_6 + 4H_2O \qquad (1)$$

At the initial stage, silicon material adjacent to a metal catalyst strip is etched and then the metal catalyst strip 114 sinks into the etched cavity to assist further etching. It is noted that the etch profile in MaCE can be tuned by the geometry of the metal catalyst 114 as well as the etchant composition. Also, during wet etching, stirring (e.g., magnetic stirring) of the solution of $H_2O_2$ and HF can aid in forming TSVs with uniform depth distribution.

Figure 1B:
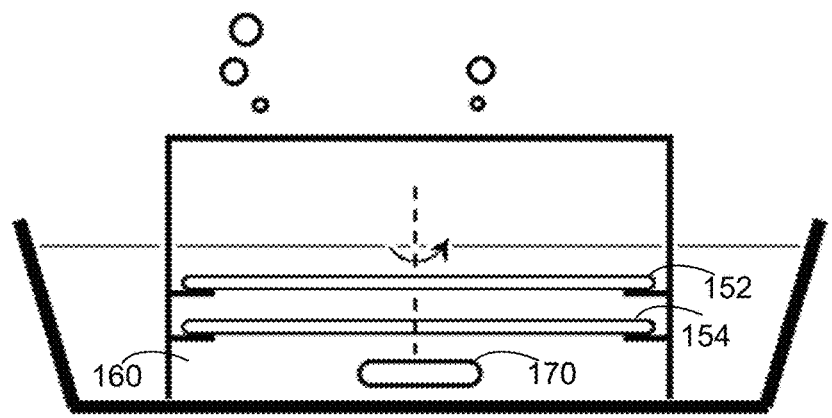
FIGS. 1(b)-1(c) are diagrams illustrating an exemplary schematic setup for a multi-wafer MaCE process for high-throughput manufacturing in accordance with embodiments of the present disclosure.
Figure 1C:
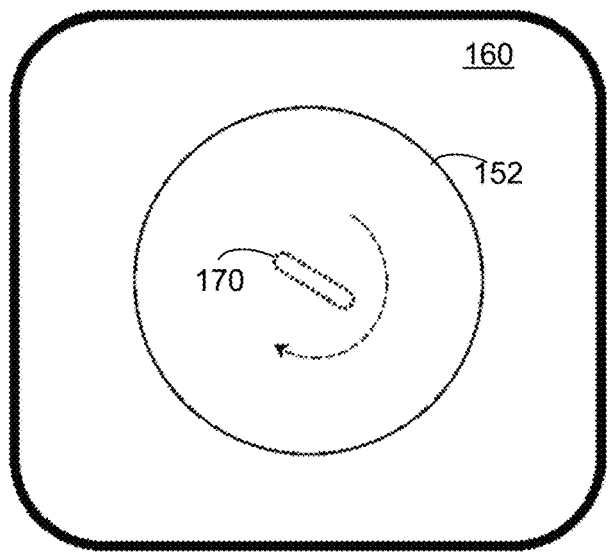
Figure 1D:
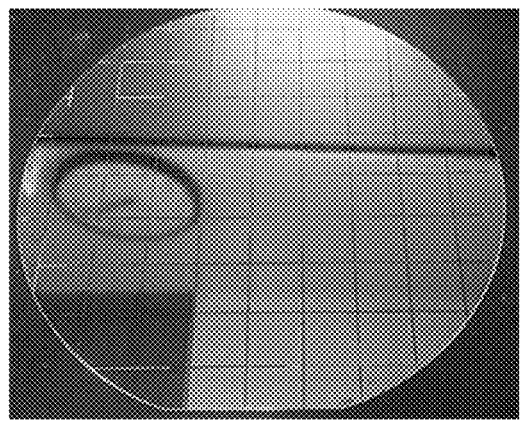
FIG. 1(d) is an image of a wafer processed using the multi-wafer MaCE process of FIGS. 1(b)-1(c).
Figure 1E:
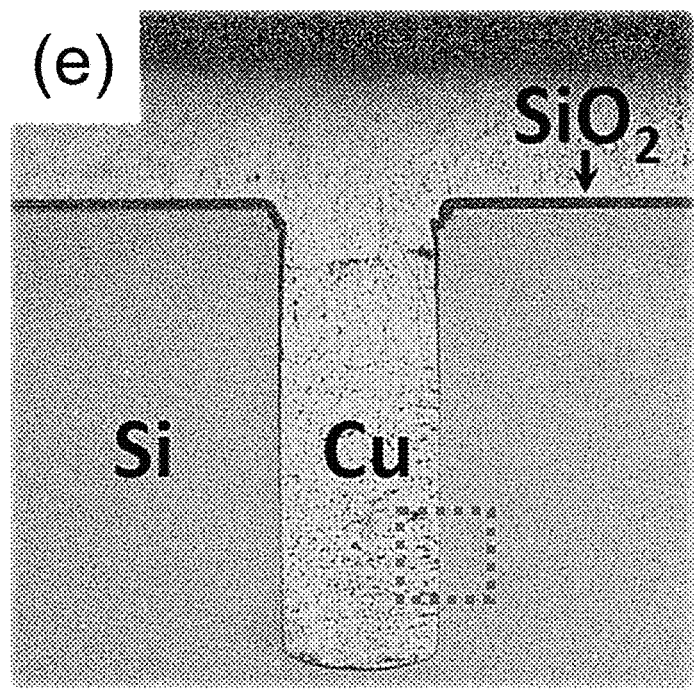
FIG. 1(e) is a scanning electron microscope image showing a cross-sectional view of a through silicon via (TSV) formed by wafer-level MaCE with a dielectric layer ($SiO_2$) and a metal filling (Cu) in accordance with embodiments of the present disclosure.
Figure 1F:
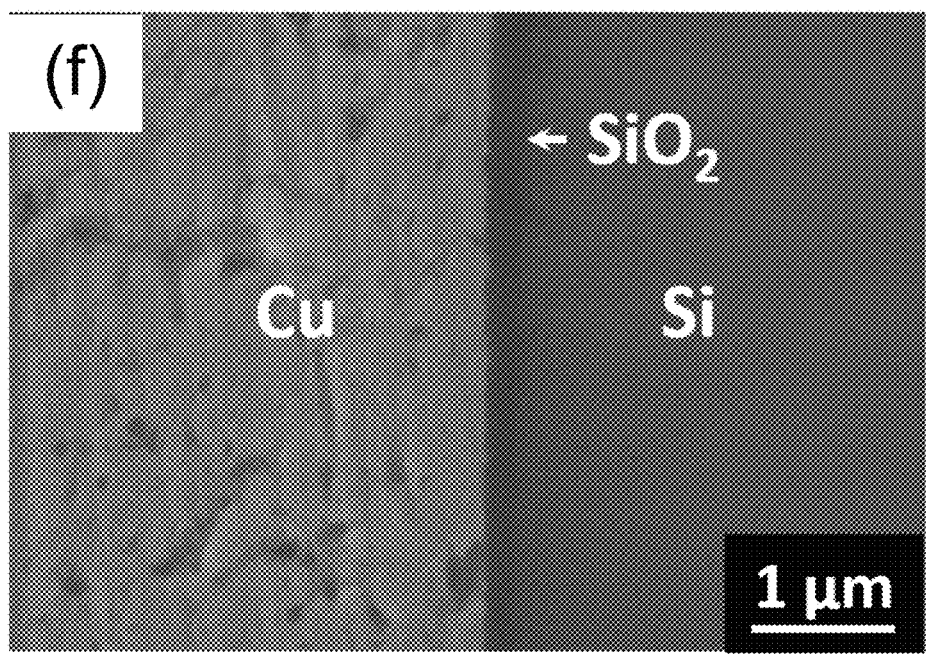
FIG. 1(f) is a scanning electron microscope image showing an enlarged view of a portion of a smooth sidewall of the TSV shown in FIG. 1(e) in accordance with embodiments of the present disclosure.

Etching results indicate an even higher throughput of MaCE when multiple wafers are etched in the same container, which makes the technology greatly appealing for industry application, as illustrated in FIGS. 1(b)-1(c). For example, FIG. 1(b) shows a side view of an exemplary schematic setup for multi-wafer MaCE for high-throughput manufacturing. In the figure, multiple wafers 152, 154 are shown positioned and immersed in a wet etching solution 160 that may be stirred via a magnet or other type of stir element 170. FIG. 1(c) shows a top view of the exemplary schematic setup of FIG. 1(b). Next, FIG. 1(d) is an image of a real wafer after MaCE in accordance with embodiments of the present disclosure. In addition, FIG. 1(e) illustrates an example of through silicon vias (TSV) etched by wafer-level MaCE with a dielectric layer (SiO2) and a metal filling (Cu). Correspondingly, FIG. 1(f) shows a cross section of a smooth sidewall of the TSV shown in FIG. 1(e). As demonstrated, MaCE shows superior performance over currently available DRIE as well as traditional wet etching. Embodiments of MaCE provide a solution for 3D micro- and nanomanufacturing with order-of-magnitudes lower cost and significantly broader range of 3D geometric options.

In the past decade, high-aspect ratio silicon nanowires, pillars, pores, and 3D-complicated cavity have been successfully fabricated by MaCE. Due to the nature of wet etching, MaCE shows promising result in deep trenches etching. MaCE is not only capable of etching perfect vertical deep trenches, but also manages to obtain trenches having sidewalls with a tunable sidewall angle (where the angle between surface normal and the sidewall normal is defined as the sidewall angle (θ)). On the other hand, the etching direction in MaCE is found to be influenced comprehensively by multiples parameters, such as etchant composition and lateral geometry of the catalyst, among others. By tuning these parameters, both vertical and slanted etching have been observed using MaCE. High aspect ratio slanted etching can also be achieved by MaCE.

In order to fabricate deep trenches by MaCE, an exemplary method of the present disclosure comprises first patterning the silicon substrate 106 by photolithography (PL) or electron beam lithography (EBL) during the lithography step 102. In an exemplary method, (100)-type single crystalline silicon substrates 106 are used. An array of long strip-shape patterns may be used for trench etching in the following steps. After lithographic patterning, the metal catalyst is deposited on the patterned silicon substrate by electron beam evaporation (EBE) during the metal deposition step 110. The etching is conducted in HF—H$_2$O$_2$ etchant solution for a certain time for the wet etching step 112. After etching, the sample is washed copiously by deionized water and dried under nitrogen gas. The geometry and morphology of etched trenches are obtained by scanning electron microscope (SEM).

Figure 2A:
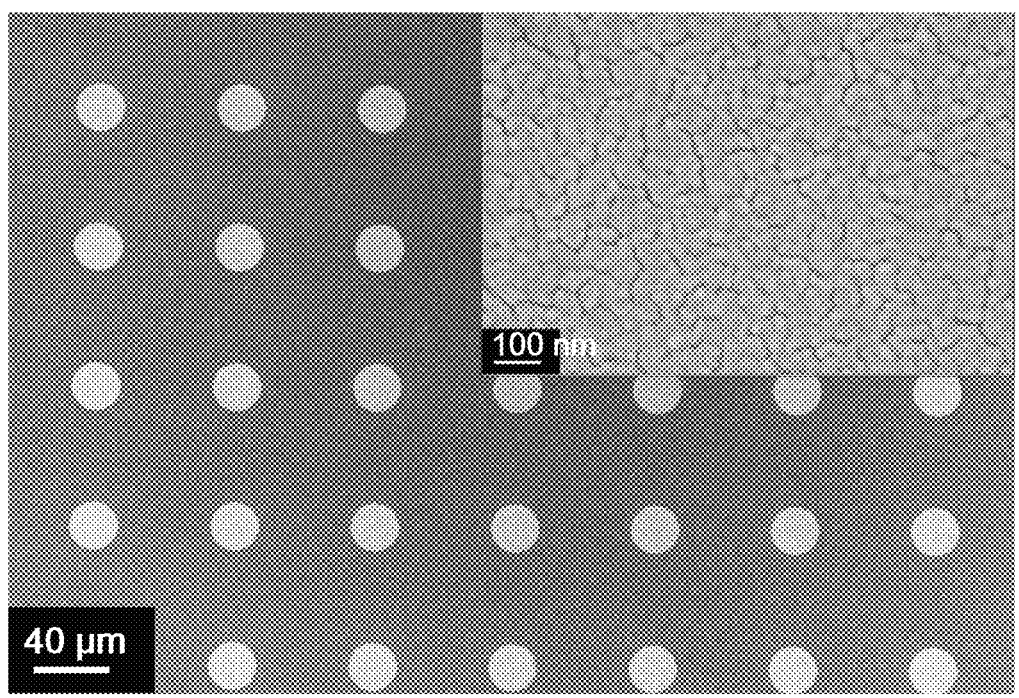
FIG. 2(a) is a scanning electron microscope image of a patterned noble metal catalyst array formed in accordance with embodiments of the present disclosure.

FIG. 2(a) is a SEM image of a patterned noble metal catalyst array formed in accordance with embodiments of the present disclosure. In particular, an array of circular Au patterns is fabricated. The inset shows the nanoscale morphology of the metal catalyst material with small pores inside the noble metal films, which may be beneficial for uniform etching. Accordingly, FIGS. 2(b)-2(d) shows a successful etching of paralleled trenches for one embodiment.

Figure 2B:
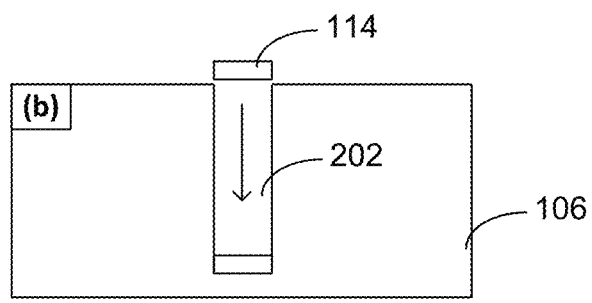
FIG. 2(b) is a schematic diagram of a vertical etching of a trench in a substrate material in accordance with embodiments of the present disclosure.

FIG. 2(b) shows a schematic diagram of a vertical etching of a trench 202 in the substrate material 106. For FIG. 2(b), only the region covered by the metal catalyst 114 is etched; other regions being kept intact. In this example, the width of the parallel trenches 202, in the SEM images of FIG. 2(c) and FIG. 2(d), is 2.0 μm, the same as the initial width of the metal catalyst 114. The depth of the trenches on the same substrate 106 falls within the range of 6.3-6.8 μm, indicating a uniform etching rate between each trench 202. The result demonstrates that uniform vertical trenches 202 can be achieved by MaCE. In one embodiment, the width of the trenches 202 can be defined by the standard lithographic methods that are ready available in a common microfabrication lab. In previous techniques, uniform etching has only been achieved on small silicon chips (e.g., 1 cm diameter). Here, uniform etching of a pattern with uniform morphology or geometry is demonstrated over a large silicon substrate (e.g., diameter of 4 inches and larger) using MaCE techniques of the present disclosure. Accordingly, embodiments of the present disclosure enable etched formations that are deep (e.g., high-aspect-ratio) and uniform as opposed to shallow etchings (i.e., low-aspect-ratio) or non-uniform deep etchings.

Figure 2C:
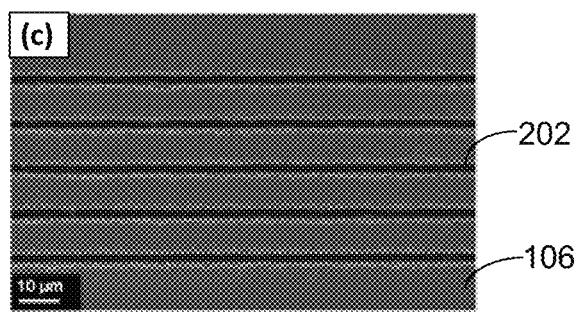
FIG. 2(c) is a scanning electron microscope image showing a top view of a patterned noble metal catalyst array formed in accordance with embodiments of the present disclosure.
Figure 2D:
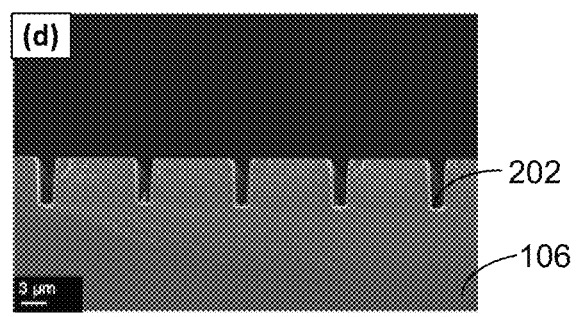
FIG. 2(d) is a scanning electron microscope image showing a cross-sectional view of a patterned noble metal catalyst array formed in accordance with embodiments of the present disclosure.
Figure 3A:
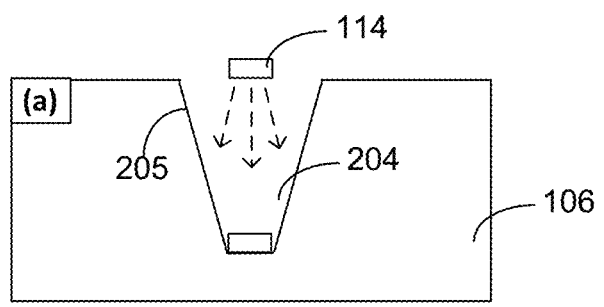
FIG. 3(a) is a schematic diagram of tapered trenches formed by MaCE in accordance with embodiments of the present disclosure.

FIG. 3(a) shows a schematic diagram of tapered trenches 204 etched by MaCE, where the trenches 204 are etched at a higher temperature than used for vertical trench etching (FIGS. 2(b)-(d)). Significant tapering of sidewalls 205 can be observed in FIG. 3(b). The tapering phenomenon can be explained from the etching mechanism of MaCE. In MaCE, the overall etching reaction can be treated as the combination of two half reactions:

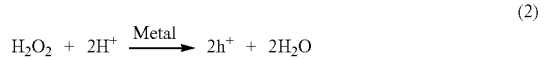

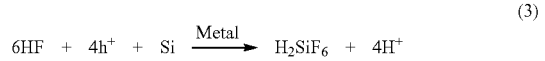

where h$^+$ refers to electronic holes. At the elevated temperature, the rate constant k of both half reactions tends to increase. The tapering phenomenon indicates that k of reaction (2) probably increases more than that of reaction (3). Under this condition, h$^+$ generated from reaction (2) exceed that which can be consumed by reaction (3). The excessive h$^+$ will diffuse from the catalyst towards the sidewalls and cause the extra etching, which renders the sidewall as tapered.

Figure 3B:
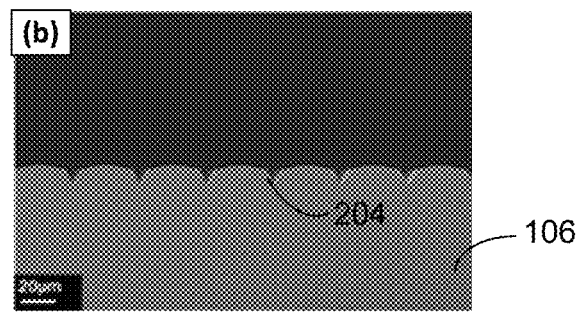
FIG. 3(b) is a scanning electron microscope image showing a cross-sectional view of tapering of sidewalls formed by MaCE in accordance with embodiments of the present disclosure.

In FIG. 3(b), the sidewall angle of the trenches 204 is measured to be 65°. Compared to the tapered trenches etched by traditional basic wet etching, the unique 65° sidewall angle shown in FIG. 3(b) indicates that the sidewalls of the tapered trenches 204 do not belong to any low-index crystalline plane. In other words, the tapering phenomenon is not caused by the difference of etching rates on various crystalline planes. Thus, MaCE may be able to fabricate trenches with an arbitrary sidewall angle. Also, the sidewall of the trenches 204 appears smooth and flat, which is different from the stepwise tapered trenches made by reactive ion etching (RIE). Thus, MaCE is potentially advantageous over both traditional basic wet etching as well as RIE in that the sidewalls of trenches 204 are smooth and flat with a flexible range for the sidewall angle.

Figure 4:
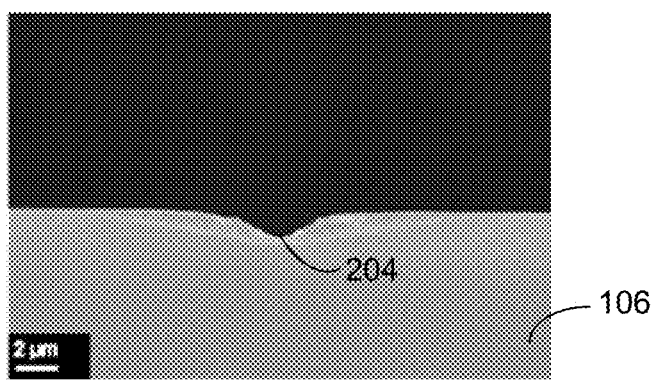
FIG. 4 is a scanning electron microscope image showing a cross-sectional view of tapering of sidewalls formed by MaCE with the addition of ethanol (EtOH) in accordance with embodiments of the present disclosure.

It has been reported that the addition of non-aqueous liquid induces the bending of silicon nanowires made by MaCE. In this regards, the vertical etching experiment shown in FIGS. 2(b)-2(d) is repeated with the addition of ethanol (EtOH). From this experiment, tapered trenches 204 can be found, as shown in FIG. 4.

Figure 5:
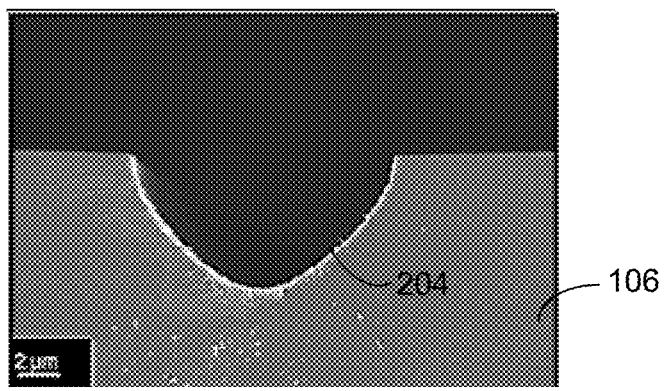
FIG. 5 is a scanning electron microscope image showing a cross-sectional view of tapering of sidewalls formed by MaCE with the addition of ethanol (EtOH) and a different type of catalyst material with respect to the etching process of FIG. 4.

Compared to the result of vertical etching, the vertical etching rate dropped from 0.7 μm/min to 0.1 μm/min, and the opening width of trenches 204 increased to 2 μm to 14 μm. The sidewall angle dropped to 28°. Trenches with such a low sidewall angle are hardly reported by literature within the art. Again, the sidewall angle of 28° cannot be related to any low index crystalline plane of silicon 106, which further supports the point that trenches 204 with an arbitrary sidewall angle can be obtained by MaCE. Interestingly, upon addition of EtOH, the sidewall and the adjacent region shows nanoporous morphology, indicating the h$^+$ density might be essentially different from the vertical etching conditions. Further, if the type of catalyst 114 is changed, then the etched trenches 204 may be formed and shown to possess semi-circular cross section, as shown in FIG. 5, which highly resembles the result of acidic wet etching.

Figure 6A:
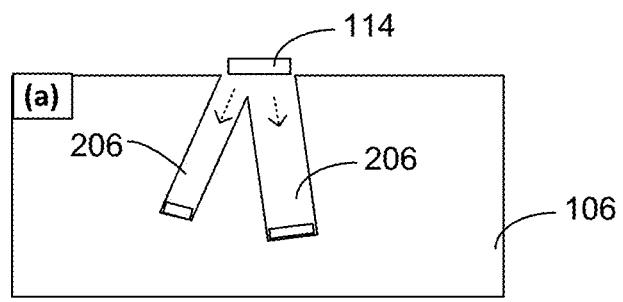
FIG. 6(a) is a schematic diagram of an etching process to fabricate slanted trenches using MaCE in accordance with embodiments of the present disclosure.
Figure 6B:
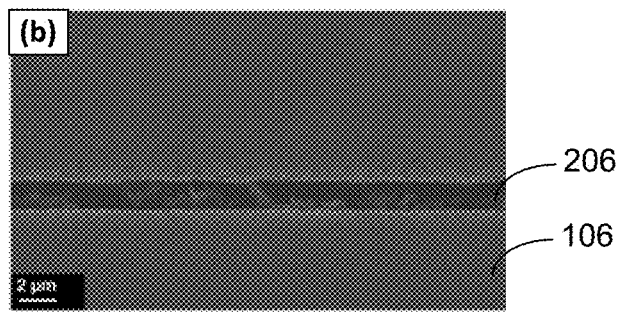
FIG. 6(b) is a scanning electron microscope image showing a top view of a trench opening etched using MaCE in accordance with embodiments of the present disclosure.
Figure 6C:
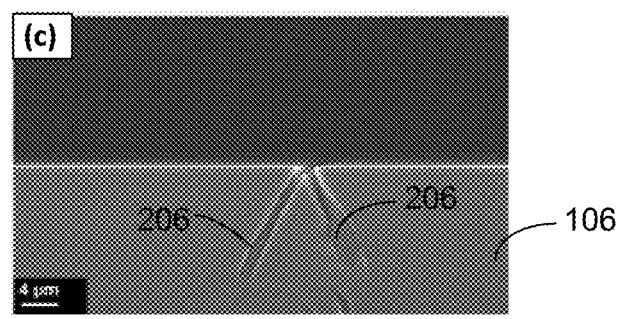
FIG. 6(c) is a scanning electron microscope image showing a cross-sectional view of a trench having two different paths within a substrate material etched using MaCE in accordance with embodiments of the present disclosure.

Besides the tapered trenches 204 shown above, MaCE is capable of slanted trench etching. FIG. 6(a) shows a schematic etching process to fabricate slanted trenches 206 using MaCE in accordance with one embodiment. Here, a slanted trench 206 can be formed with a higher HF concentration compared to that of vertical trenches 202 (where a sidewall angle approaches 90°). After etching, the top surface of the substrate 106 keeps intact except the trench opening, and some not fully-etched silicon "grass" remains in the trench 206, as shown in FIG. 6(b) (top-view SEM). The catalyst strip 114 breaks into two parts after etching into the substrate 106 for a short time, and the two subunits proceed into two different directions, as shown in FIG. 6(c).

Figure 7A:
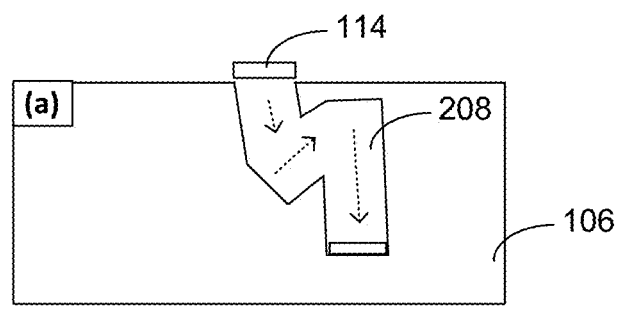
FIG. 7(a) is a schematic diagram showing an etching process to fabricate slanted trenches with three-dimensional complexity using MaCE in accordance with embodiments of the present disclosure
Figure 7B:
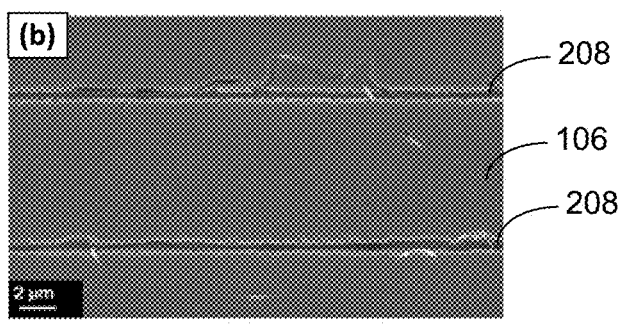
FIG. 7(b) is a scanning electron microscope image showing a top view of slanted trenches formed using the etching process of FIG. 7(a).
Figure 7C:
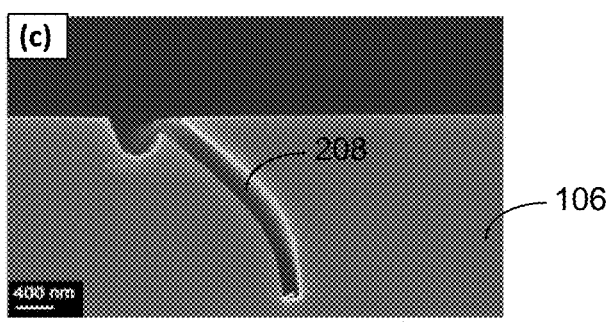
FIG. 7(c) is a scanning electron microscope image showing a cross-sectional view of a slanted trench formed using the etching process of FIG. 7(a).

On another case where catalyst strips 114 are patterned with a submicron width, a different slanted profile is observed. FIG. 7(a) shows a schematic etching process for forming slanted trenches 208 with 3D complexity by MaCE. FIG. 7(b) shows the etching of 600 nm-wide catalyst strips 114 in the same etchant as that of vertical etching. From a top-view SEM image, a lateral "swinging" of the catalyst strip 114 can be observed, as shown in FIG. 7(b). The cross-sectional image further illustrates that the strip 114 moves up and down inside silicon substrate 106 and forms slanted trenches 208 with 3D complexity, as shown in FIG. 7(c). The slanted trenches 208 mentioned above possess high aspect ratio and 3D complexity that cannot be achieved by currently available etching methods. Several key experimental parameters, including etchant composition, temperature, type, and lateral dimension of catalyst, are found to effectively tune the geometry of the trench or etching profile. Further, surface properties of the substrate may be controlled in order to determine a dimensions or morphology of the metal catalyst (which can control the etching profile).

Referring back to Eqn. 2, in MaCE, $h^+$ are generated from decomposition of hydrogen peroxide ($H_2O_2$) by the catalysis 114 of noble metal:

$$H_2O_2 + 2H^+ \xrightarrow{\text{noble metal}} 2H_2O + 2h^+ \quad (2)$$

If a silicon substrate 106 is deposited with noble metal catalysts 114 on a top surface and immersed in HF—$H_2O_2$ mixture solution, $h^+$ are selectively generated on the surface of the catalysts 114 and injected into the silicon material 106 underneath, which is then etched by HF. Since the catalysts 114 are the only source of $h^+$ and etching of bare silicon by $H_2O_2$—HF solution is negligible, the location and lateral geometry of the etching profile is defined by that of the catalysts 114, while the cross-sectional geometry follows the movement of catalysts 114 and $h^+$ during etching. Uniform silicon nanowires have been successfully fabricated by MaCE using interconnected mesh-shaped catalysts.

Embodiments of the present disclosure further include a unique silicon etching technique, referred as electric bias-attenuated metal-assisted chemical etching (EMaCE), to form isolated microstructures that are desirable for bulk micromachining of elemental silicon (BMS). It is noted that the transport of HF and $h^+$ are two critical processes for BMS by MaCE, where controlling the diffusion of $h^+$ is important to avoid excessive etching in the silicon substrate 106 between metal catalyst patterns 114 which can be detrimental to devices and components built on the etched structures. Accordingly, embodiments of EMaCE control the excessive etching by using external electric bias during a MaCE process.

Figure 8A:
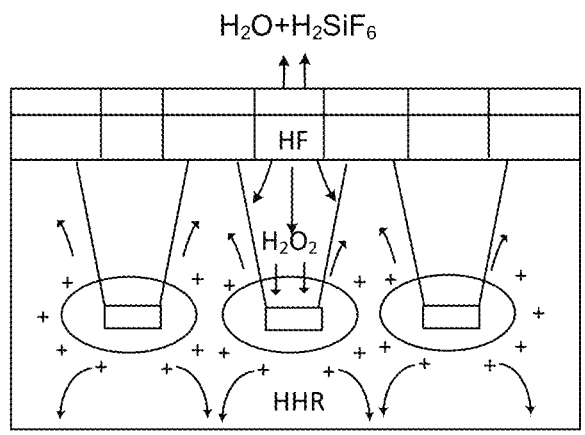
FIGS. 8(a)-8(b) are schematics of charge transport in a metal-assisted chemical etching (MaCE) process and an electric bias-attenuated metal-assisted chemical etching (EMaCE) process in accordance with embodiments of the present disclosure.
Figure 8B:
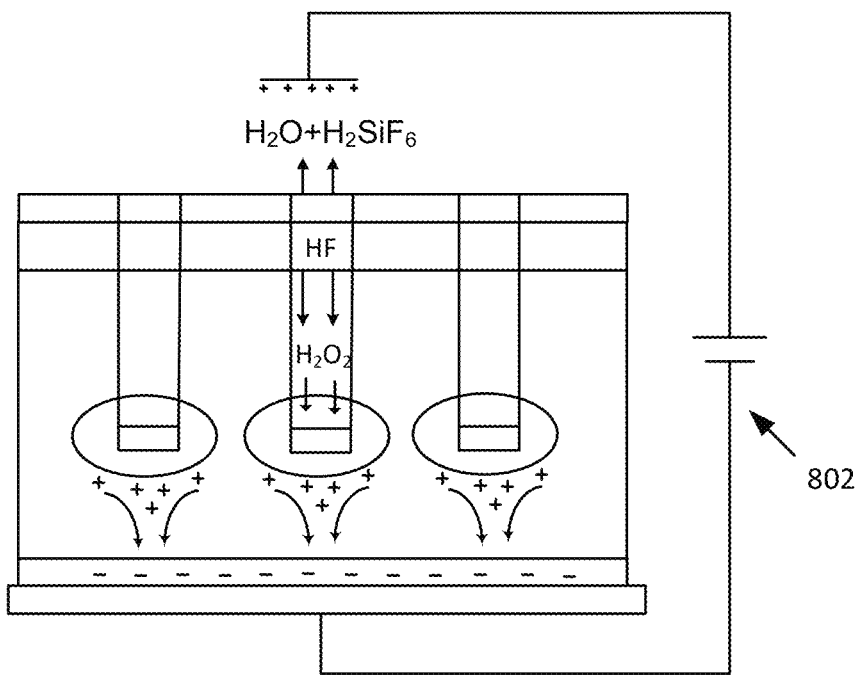

For example, during an exemplary MaCE process, after metal deposition, a silicon wafer 106 having Au patterns 114 may be cut into 1×1 cm² chips. Then, for the additional step of wet etching, there is a risk of excessive etching which originates from the uncontrollable diffusion of $h^+$, as shown in FIG. 8(a). However, if a negative bias 802 is applied from the back side of the chips, $h^+$ will be drawn to the back side and thus excessive etching will be suppressed in a controllable manner, as shown in FIG. 8(b) for an exemplary EMaCE process.

Figure 9:
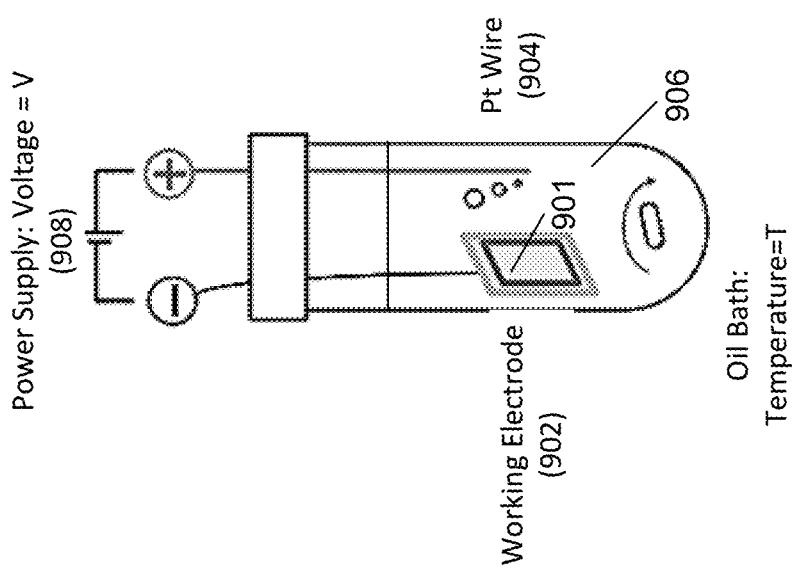
FIG. 9 is a schematic of a setup for the EMaCE process in accordance with embodiments of the present disclosure.
Figure 10A:
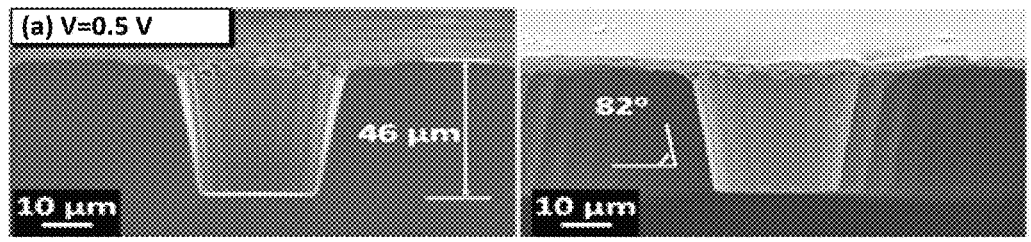
FIG. 10(a) depicts scanning electron microscope images of cross-sectional views of an etched chip (left) and corresponding polymer replica (right) formed by an EMaCE process at −0.5 V in accordance with embodiments of the present disclosure.
Figure 10B:
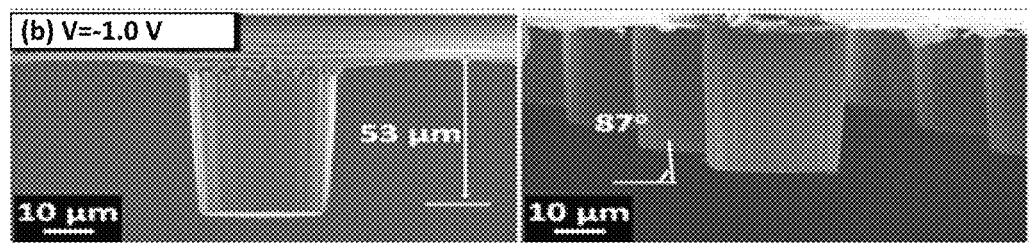
FIG. 10(b) depicts scanning electron microscope images of cross-sectional views of an etched chip (left) and corresponding polymer replica (right) formed by an EMaCE process at −1.0 V in accordance with embodiments of the present disclosure.
Figure 10C:
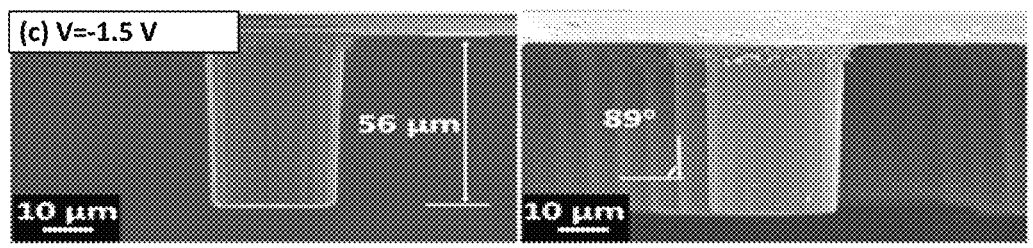
FIG. 10(c) depicts scanning electron microscope images of cross-sectional views of an etched chip (left) and corresponding polymer replica (right) formed by an EMaCE process at −1.5 V in accordance with embodiments of the present disclosure.
Figure 10D:
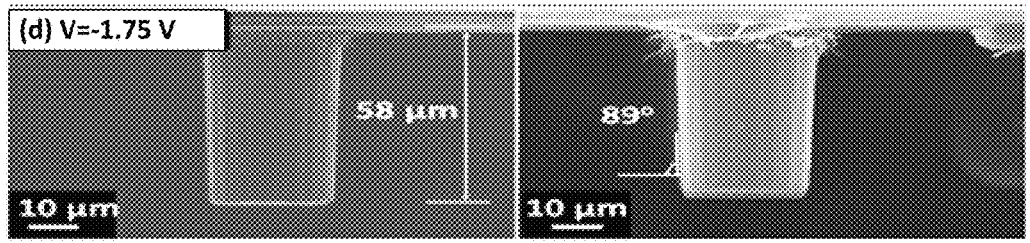
FIG. 10(d) depicts scanning electron microscope images of cross-sectional views of an etched chip (left) and corresponding polymer replica (right) formed by an EMaCE process at −1.75 V in accordance with embodiments of the present disclosure.

As shown in FIG. 9, a basic setup for the EMaCE process may be realized by connecting the chip 901 to the negative output terminal of a direct current electric power supply as the working electrode 902, and connecting a platinum (Pt) wire 904 to the positive terminal as the counter electrode. Both electrodes may be immersed in the HF—$H_2O_2$ etchant 906, during which a certain value of voltage (V) is set in the power supply 908 so that the chip 901 is negatively biased by V relative to the Pt wire (referred as "at −V"). In one embodiment, to provide electric contact between the chip 901 and the power supply 908, the chip 901 is mounted on a gallium-wet copper substrate in a carrier where all surfaces are protected by a polymer material except the front surface of the chip.

The results of EMaCE at −0.5V, −1.0 V, −1.5 V and −1.75 V for 10 min are shown in FIGS. 10(a)-(d). The cross sections of the etched chips and corresponding polymer replicas are shown in the left and right column, respectively. The polymer replica helps in revealing the true 3D geometry of the etching profile since the cross section of the etched chip may vary with the sample preparation process. The angle between surface normal and the sidewall normal is defined as a sidewall angle (θ). Here, θ and the etching depth for the respective trench increases as the voltage bias goes more negative. The results indicate that diffusion of $h^+$ can be influenced by negative bias. As the strength of bias increased, more holes ($h^+$) that tend to diffuse towards the top surface and sidewalls are shown to be driven towards the backside. In other words, the negative bias redistributed the concentration of holes (h+) so that etching on the top surface and the sidewall was suppressed and the etching in the vertical direction was enhanced. When the bias was increased to −1.75 V, the surface of silicon between Au patterns is shown to have kept its original color and polished morphology, and the opening of etched holes kept the original diameter of Au pattern as 29 μm, indicating a complete suppression of excessive etching.

To further illustrate the proposed mechanism of EMaCE for one embodiment, the bias from −0.10 V to −3.10 V is swept continuously at the rate of 5 mV/s for an exemplary experiment. The current-bias curve is shown as the non-horizontal line in FIG. 11(a). The negative sign of current is defined as the condition where $h^+$ is flowing away from the working electrode, i.e. the chips and electrons are injected into the chips. Since p-type silicon substrate is used during this experiment, the contact between the back side of Si and gallium-wet copper substrate forms a forward-biased Schottky contact when electrons are injected into silicon. The non-linear increase of current versus bias with an onset voltage of approximately −0.6 V is consistent with the typical features of forward-biased Schottky contact. The current increased sharply as the bias exceeds −0.6 V until −1.5V, beyond which the increase of the current became unstable. In contrast, when the same experiment was done in a $\rho(1)^{1.8}$ etchant (i.e. etchant without $H_2O_2$), the current stays negligible across the whole etching experiment (at top horizontal line of FIG. 11(a)). Actually, Au catalysts hardly etched into the substrate in $\rho(1)^{1.8}$, only some pores along the family of crystalline orientation were found around the Au, as shown in FIG. 12 (where FIGS. 12(b) and 12(d) show enlarged images corresponding to FIGS. 12(a) and 12(c)).

Figure 11A:
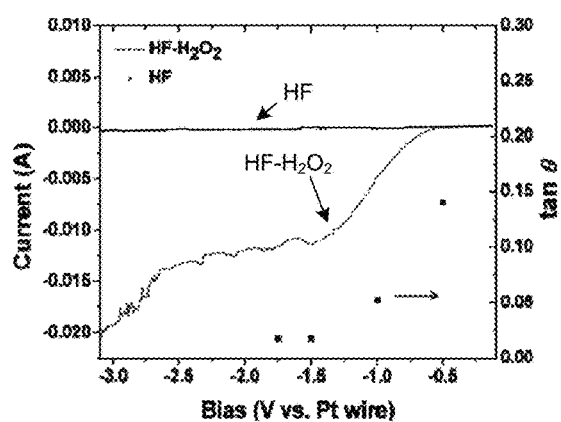
FIGS. 11(a)-11(b) are charts plotting current and bias values for the EMaCE process in accordance with embodiments of the present disclosure.
Figure 12A:
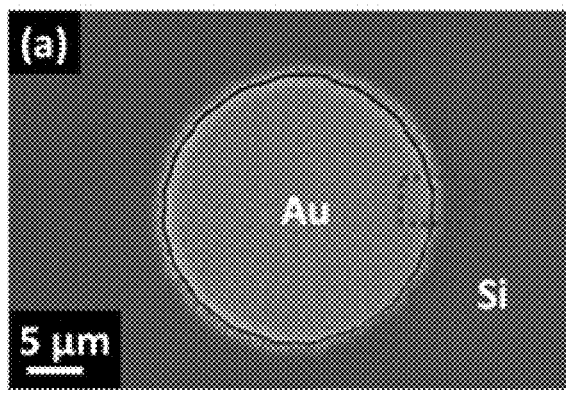
FIG. 12(a) is a scanning electron microscope image of a top view of an etched chip formed by an EMaCE process without $H_2O_2$ in accordance with embodiments of the present disclosure.
Figure 12B:
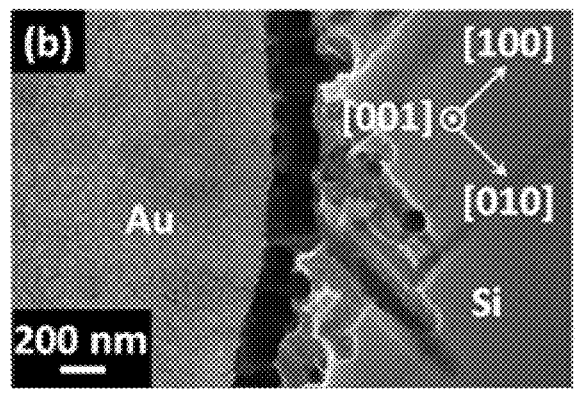
FIG. 12(b) is a scanning electron microscope image of an enlarged view of a portion of the scanning electron microscope image of FIG. 12(a).
Figure 12C:
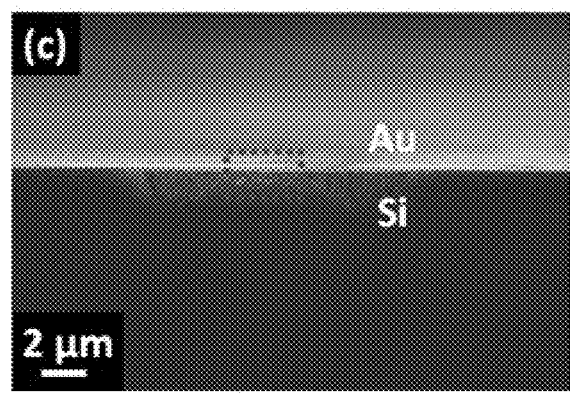
FIG. 12(c) is a scanning electron microscope image of a side view of an etched chip formed by an EMaCE process without $H_2O_2$ in accordance with embodiments of the present disclosure.
Figure 12D:
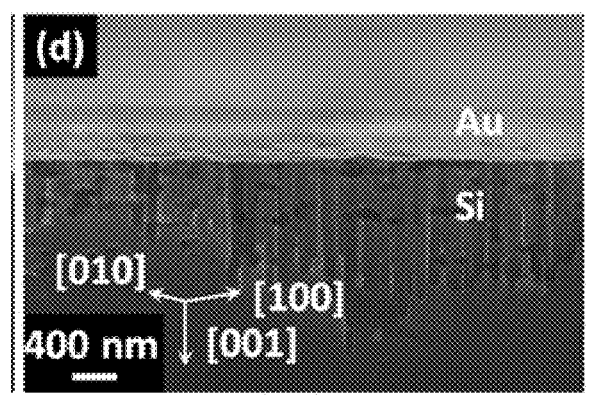
FIG. 12(d) is a scanning electron microscope image of an enlarged view of a portion of the scanning electron microscope image of FIG. 12(c).

The control experiment indicates that catalyzed decomposition of $H_2O_2$ is the source of the current in the curved (non-horizontal) line of FIG. 11(a), and the charge carriers are mainly the excessive $h^+$ generated from the reaction in Eqn. 2. Thus, EMaCE is essentially different from traditional electrochemical etching where holes ($h^+$) were injected from an external power supply. Also, since the amount of $h^+$ is limited by the kinetics of chemical reaction, the $h^+$ are being depleted during sweeping of bias, which explains the slow increase of the current at bias higher than −1.50V.

Figure 11B:
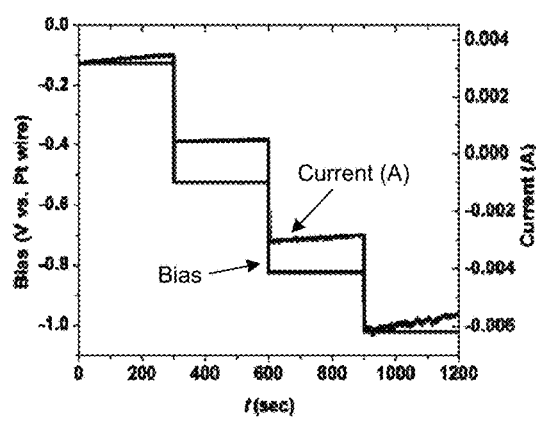
Figure 11C:
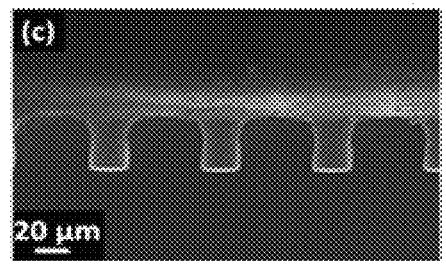
FIG. 11(c), FIG. 11(d), and FIG. 11(e) are scanning electron microscope images of cross-sectional views of etched chips using a continuous EMaCE etching process in accordance with embodiments of the present disclosure.
Figure 11D:
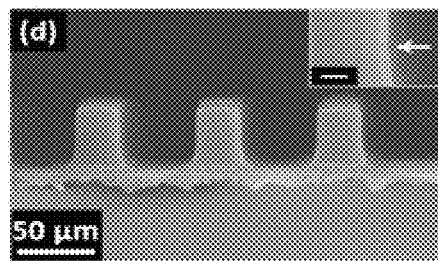
Figure 11E:
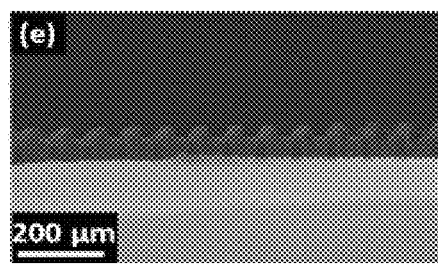
Figure 11F:
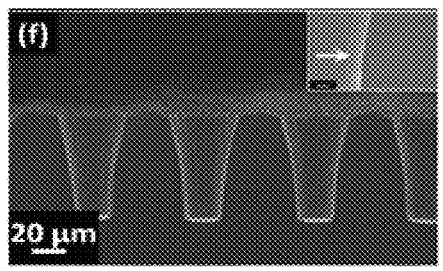
FIG. 11(f), FIG. 11(g), and FIG. 11(h) are scanning electron microscope images of cross-sectional views of etched chips using a stepwise EMaCE etching process in accordance with embodiments of the present disclosure.
Figure 11G:
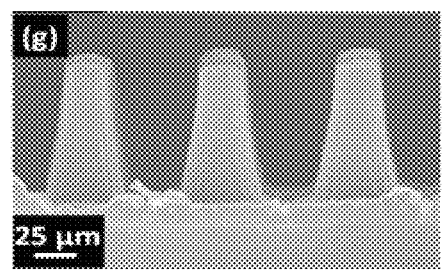
Figure 11H:
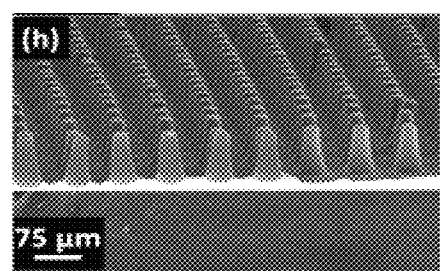

The evolution of applied bias and measured current versus etching time are shown in FIG. 11(b). As shown in the figure, the bias rested on a constant value for 300 seconds, during which current slightly increased, and the current changed and became stabilize at the new value within 1 second after the bias changed. The slight increase of current may be caused by the geometry change during etching. The etching result of continuous EMaCE and stepwise EMaCE are shown in FIGS. 11(c)-(e) and 11(f)-(h).

In continuous EMaCE, the sidewall angle increased as the Au etched deeper. At the depth of approximately 20 μm below the top surface, the sidewall angle became 90 degrees. In stepwise EMaCE, the sidewall angle increased stepwise. In both cases, the etching profiles were uniform across the whole chips, as illustrated by the low-magnification SEM image of polymer replicas. The results demonstrate that the 3D geometry of etching can be facilely designed by programming the variation of bias over etching time, thus paving the way for EMaCE as a novel BMS method with true 3D controllability.

To investigate the capability of high-speed etching by EMaCE, an embodiment of the EMaCE technique was performed in $\rho(0.55)^{3.6}$ etchant to form the etched chip shown in FIG. 10(*d*). After etching for 11 minutes, the Au catalysts penetrated 113 µm into the silicon substrate with sidewall angle >89°. When viewed under SEM with high magnification, the sidewall roughness is well below 50 nm. The low sidewall (<50 nm) roughness at high etching speed (>10 µm/min) demonstrates the superiority of EMaCE over state-of-the-art high-speed DRIE where sidewall roughness compromises to the etching rate. Accordingly, MaCE and EMaCE show superior performance over currently available DRIE as well as traditional wet etching. Embodiments of the present disclosure provide solutions for 3D micro- and nanomanufacturing with order-of-magnitudes lower cost and significantly broader range of 3D geometric options.

Figure 13:
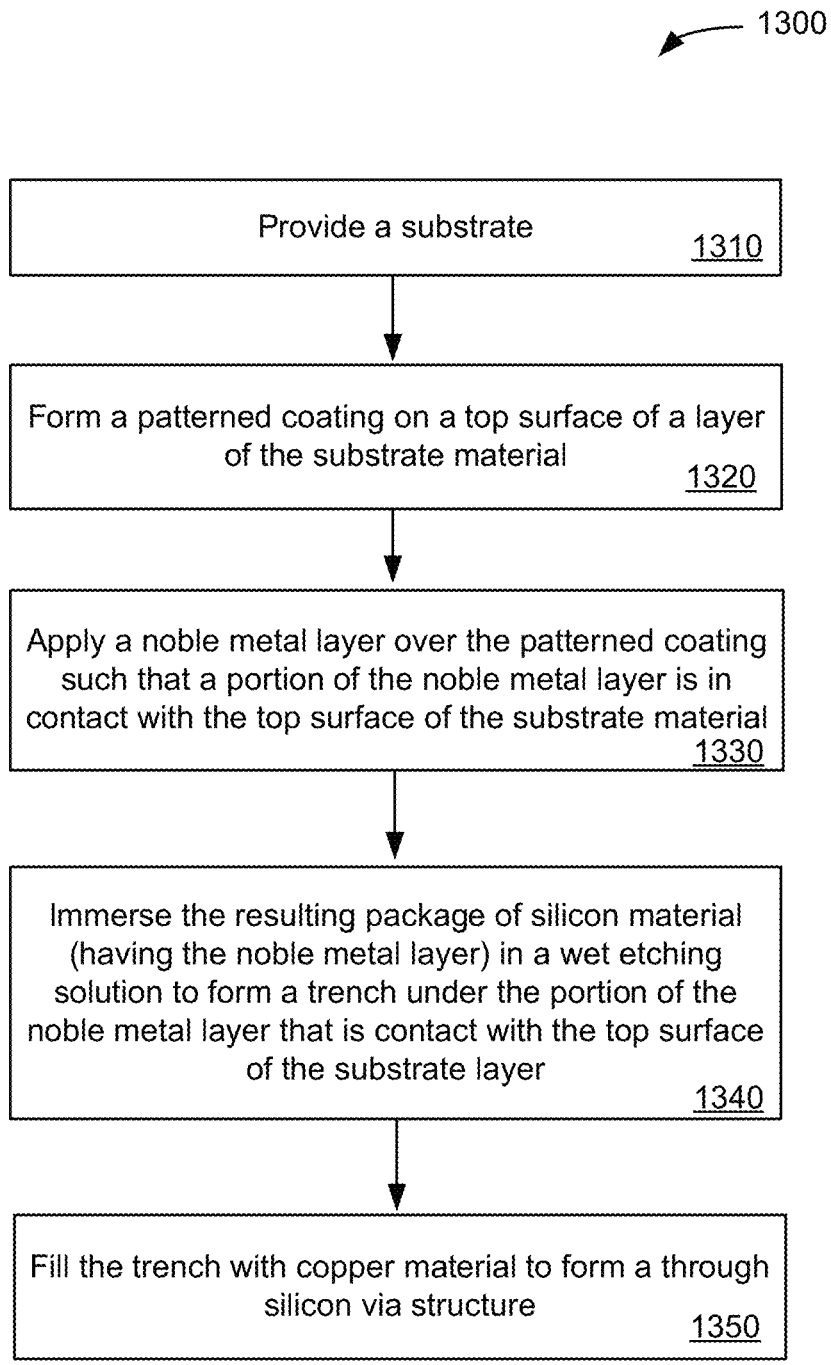
FIG. 13 is a flow chart diagram illustrating a metal-assisted chemical etching (MaCE) process in accordance with embodiments of the present disclosure.

Referring now to FIG. 13, shown is a flow chart 1300 illustrating a metal-assisted chemical etching of a semiconductive substrate according to various embodiments of the present disclosure. Beginning with block 1310, a substrate 106 is provided. The substrate material 106 may be silicon or other appropriate material as known to one of ordinary skill in the art. A patterned coating 104 is then formed on a top surface of a layer of the substrate material 106 in block 1320, as discussed previously. In block 1330, a noble metal layer 114, such as gold (Au), is applied or deposited (e.g., via DC sputtering) over the patterned coating 104 such that a portion of the noble metal layer 114 is in contact with the top surface of the substrate material 106. Next, in block 1340, the resulting package of silicon material 106 (having the noble metal layer 114) is immersed in a wet etching solution to form a trench under the portion of the noble metal layer 114 that is contact with the top surface of the substrate layer 106, as previously discussed. Further, the trench may be filled with copper material to form a through silicon via structure, as shown in block 1350.

Figure 14:
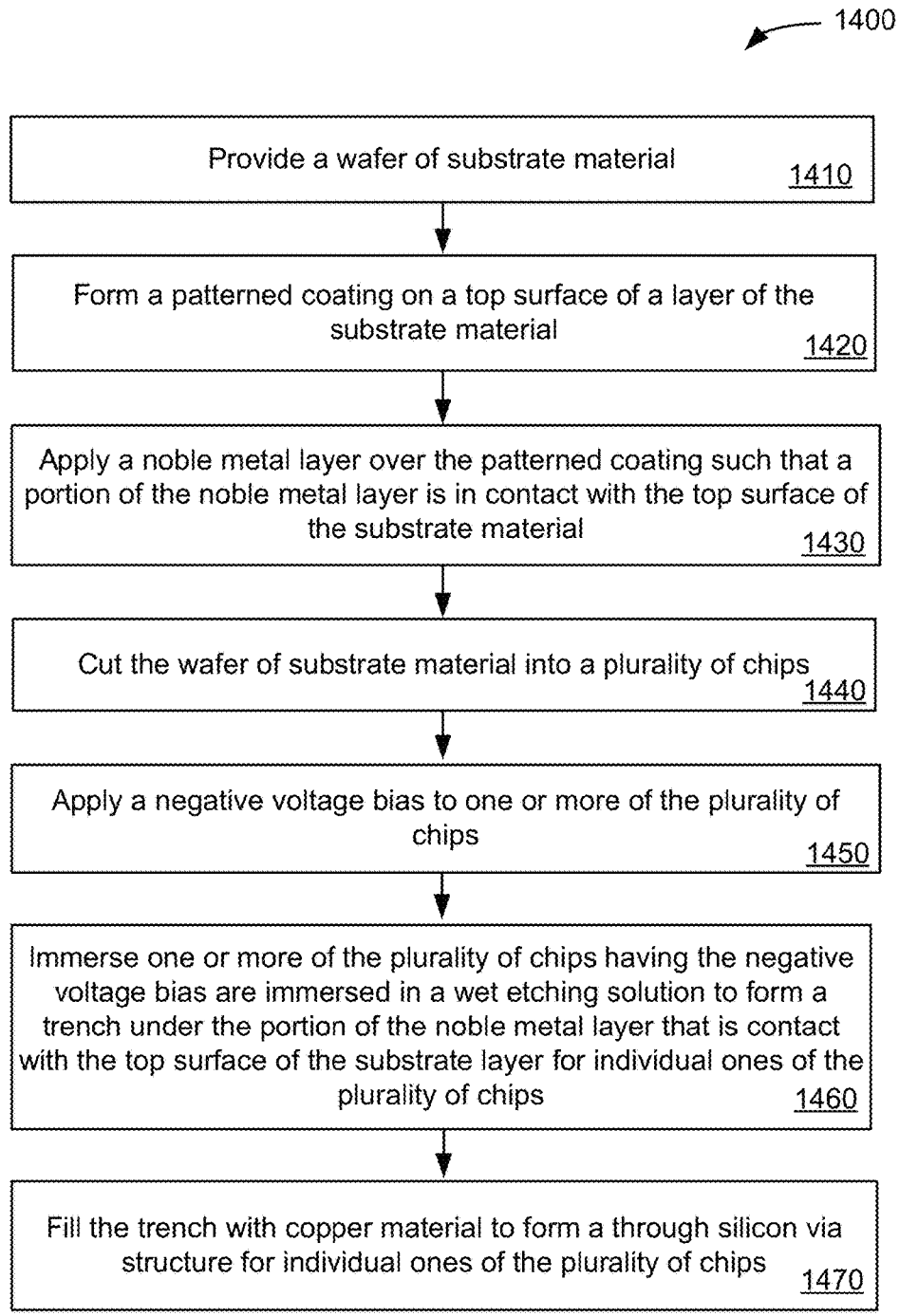
FIG. 14 is a flow chart diagram illustrating an electric bias-attenuated metal-assisted chemical etching (EMaCE) process in accordance with embodiments of the present disclosure.

Next, in FIG. 14, a flow chart 1400 is provided that illustrates an electric bias-attenuated metal-assisted chemical etching of a semiconductive substrate according to various embodiments of the present disclosure. Beginning with block 1410, a layer or wafer of substrate material 106 is provided. The substrate material 106 may be silicon or other appropriate material as known to one of ordinary skill in the art. A patterned coating 104 is then formed on a top surface of a layer of the substrate material 106 in block 1420, as discussed previously. In block 1430, a noble metal layer 114, such as gold (Au), is applied or deposited over the patterned coating 104 such that a portion of the noble metal layer 114 is in contact with the top surface of the substrate material 106. Next, in block 1440, the wafer of substrate material 106 is cut or segmented into a plurality of chips 901. In block 1450, a negative voltage bias is applied to one or more of the plurality of chips 901. Then, in block 1460, one or more of the plurality of chips 901 having the negative voltage bias are immersed in a wet etching solution 906 to form a trench under the portion of the noble metal layer that is contact with the top surface of the substrate layer for individual ones of the plurality of chips 901, as previously discussed. Next, the trench may be filled with copper material to form a through silicon via structure for individual ones of the plurality of chips 901, as shown in block 1470.

It should be emphasized that the above-described embodiments of the present disclosure are merely possible examples of implementations, merely set forth for a clear understanding of the principles of the present disclosure. Many variations and modifications may be made to the above-described embodiment(s) without departing substantially from the spirit and principles of the present disclosure. All such modifications and variations are intended to be included herein within the scope of this disclosure and protected by the following claims.

Therefore, at least the following is claimed:

1. A method for forming semiconductor structures comprising:
   forming a patterned coating on a top surface of a substrate layer of a silicon wafer;
   applying a single metal layer comprising a noble metal layer over the patterned coating such that a portion of the noble metal layer is in contact with the top surface of the substrate layer, wherein the noble metal layer possesses a nanoporous morphology prior to etching of the noble metal layer; and
   immersing the silicon wafer in a wet etching solution to form a trench under the portion of the noble metal layer that is contact with the top surface of the substrate layer of the silicon wafer,
   wherein an etching profile of the trench is rationally determined by controlling a thickness of the noble metal layer, a morphology of the noble metal layer, and a composition of the wet etching solution.

2. The method of claim 1, further comprising filling the trench with copper material to form a through silicon via structure.

3. The method of claim 1, wherein the noble metal layer comprises a layer of gold.

4. The method of claim 1, further comprising controlling surface properties of the substrate before preparation of the noble metal layer in order to control the morphology of the noble metal layer.

5. The method of claim 1, wherein the noble metal layer is applied via DC sputtering.

6. The method of claim 1, wherein a thickness of the noble metal layer is substantially uniform over the silicon wafer with absolute variation of 1 nanometer or below, wherein a diameter of the silicon wafer is at least 4 inches.

7. The method of claim 1, wherein the wet etching solution comprises a solution of $H_2O_2$ and HF.

8. The method of claim 7, wherein the wet etching solution further comprises ethanol.

9. The method of claim 1, wherein the etching profile of the trench is further rationally determined by controlling a temperature of the wet etching solution.

10. The method of claim 1, further comprising stirring the wet etching solution during immersion of the silicon wafer.

11. The method of claim 1, wherein the trench is substantially vertical, wherein the trench is substantially uniform with depth variation of 4% or less and with a complete removal of silicon inside the trench due to the nanoporous morphology of the noble metal layer, wherein the sidewall roughness of the trench is 50 nm or less, wherein a diameter of the silicon wafer is at least 4 inches.

12. The method of claim 1, wherein the trench is slanted.

13. The method of claim 1, wherein sidewalls of the trench are substantially tapered.

14. A method for controlling excessive etching in forming semiconductor structures comprising:
   forming a patterned coating on a top surface of a substrate layer of a silicon wafer;
   applying a single metal layer comprising a noble metal layer over the patterned coating such that a portion of the noble metal layer is in contact with the top surface of the substrate layer of the silicon wafer, wherein the noble metal layer possesses a nanoporous morphology prior to etching of the noble metal layer;

cutting the silicon wafer into a plurality of chips;

applying a negative voltage bias to one or more of the plurality of chips; and immersing the one or more of the plurality of chips having the negative voltage bias in a wet etching solution to form a trench under the portion of the noble metal layer that is contact with the top surface of the substrate layer.

15. The method of claim 14, wherein the noble metal layer is applied via DC sputtering.

16. The method of claim 14, further comprising filling the trench with copper material to form a through silicon via structure.

17. The method of claim 14, wherein the wet etching solution comprises a solution of $H_2O_2$ and HF.

18. The method of claim 14, further comprising stirring the wet etching solution during immersion of the silicon wafer.

19. The method of claim 14, wherein the trench is substantially vertical, wherein the trench is substantially uniform due to the nanoporous morphology of the noble metal layer with depth variation of 4% or less, wherein a diameter of the silicon wafer is at least 4 inches.

20. The method of claim 14, further comprising increasing the negative voltage bias to increase a depth of the trench or to increase a sidewall angle of the trench.

* * * * *